United States Patent [19]

Myrosznyk

[11] Patent Number: 5,365,088

[45] Date of Patent: Nov. 15, 1994

[54] THERMAL/MECHANICAL BUFFER FOR HGCDTE/SI DIRECT HYBRIDIZATION

[75] Inventor: James M. Myrosznyk, Santa Barbara, Calif.

[73] Assignee: Santa Barbara Research Center, Goleta, Calif.

[21] Appl. No.: 227,581

[22] Filed: Aug. 2, 1988

[51] Int. Cl.⁵ .......................................... H01L 27/14
[52] U.S. Cl. .......................................... 257/186
[58] Field of Search ................................ 357/30

[56] References Cited

U.S. PATENT DOCUMENTS

| | | | |
|---|---|---|---|
| 4,597,004 | 6/1986 | Longeway et al. | 357/30 |
| 4,692,207 | 9/1987 | Bouadma et al. | 357/30 |
| 4,694,318 | 9/1987 | Capasso | 357/30 |
| 4,700,209 | 10/1987 | Webb | 357/30 |

*Primary Examiner*—David C. Cain
*Attorney, Agent, or Firm*—W. C. Schubert; W. K. Denson-Low

[57] ABSTRACT

A Group II–VI photodetector array 12 is coupled to a silicon readout circuit 14 by means of a thermal/mechanical buffer 16 comprised of a body of material which has a characteristic thermal expansivity which is more similar to that of the thermal expansivity of the Group II–VI material than that of silicon. One suitable material is $Al_2O_3$. The buffer has a plurality of conductive vias 18 formed therethrough, each of the conductive vias being "bumped" at opposite ends thereof. The buffer accommodates the differing expansivities of, for example, HgCdTe and silicon, thereby relieving thermally generated stresses with a consequent improvement in the reliability of the resulting hybrid structure.

21 Claims, 1 Drawing Sheet

THERMAL/MECHANICAL BUFFER FOR HGCDTE/SI DIRECT HYBRIDIZATION

FIELD OF THE INVENTION

This invention relates generally to a photodetector array which is hybridized with a readout integrated circuit and, in particular, relates to a photodetector array comprised of Group II–VI material, such as mercury-cadmium-telluride (HgCdTe), which is hybridized with a silicon (Si) readout integrated circuit through a buffer layer comprised of material having a coefficient of thermal expansion which is similar to that of the Group II–VI material, such as sapphire ($Al_2O_3$).

Background of the Invention

The reliability of relatively large area HgCdTe/Si direct hybrids is currently limited by the inherent thermal expansion mismatch between the HgCdTe and the silicon. It has been known to directly hybridize these two types of materials; that is, to connect the HgCdTe photodetector array directly to an underlying silicon readout circuit. However, the long term reliability of such directly connected hybrids has been found to be insufficient when these types of hybrids are thermally cycled over several hundred cycles between ambient temperature and the typical 78K operating temperature of the devices.

Presently, such direct hybrids are achieved by cold welding complementary tall indium bumps deposited on both the detector and readout circuits. Utilizing this technology relatively large (0.25 inch) HgCdTe arrays have been coupled directly to silicon readout chips. However, this approach has not provided for reliable bonding between the HgCdTe and the silicon beyond 200 thermal cycles. Furthermore, it is believed that this direct hybridization approach may prove to be even less reliable when applied to HgCdTe arrays which have linear dimensions greater than 0.25 inches.

The degradation in reliability of these types of devices results from stresses generated by the different thermal expansion coefficients of HgCdTe and silicon. These stresses may result in fatigue and opening of indium bump interconnects. These stresses may also physically deform the HgCdTe photodetector array, resulting in a failure of the array. As can be appreciated, the long term reliability of such hybrid circuits is of critical importance, especially in airborne and space applications.

It has also been known to indirectly hybridize one or more HgCdTe arrays to associated silicon readout circuits by employing a substrate of sapphire, both the array and the readout circuit being bumped to the same surface of the sapphire substrate which is provided with conductive traces on the surface. The thermal coefficient of sapphire more closely approaches that of HgCdTe than does silicon. This type of interconnect technology, which is similar to conventional printed circuit technology, has a significant disadvantage associated therewith. This disadvantage is related to the limited packing density available due to the requirement that the individual arrays and corresponding readout circuits, in addition to the conductive traces, occupy some finite amount of substrate surface area. As a result of this limitation, high density, large area two dimensional arrays cannot be coupled to readouts by this indirect hybrid approach.

It is therefore one object of the invention to provide a Group II–VI/Si hybrid circuit which is substantially more reliable than conventional hybrid circuits and which is amenable to the fabrication of high density, large area two dimensional arrays.

It is another object of the invention to provide a Group II–VI/Si hybrid circuit which comprises a thermal/mechanical buffer between, for example, a HgCdTe photodetecting array and a silicon readout circuit, the buffer having a coefficient of thermal expansion which more closely matches that of HgCdTe than does the coefficient of thermal expansion of silicon.

It is another object of the invention to provide a HgCdTe/Si hybrid array having a thermal/mechanical buffer interposed between the photodetector array and the readout circuit, the thermal/mechanical buffer comprising a layer of sapphire having conductive vias formed through the layer which interconnect the HgCdTe photodetector array to the underlying readout circuit.

It is another object of the invention to provide a method of reliably coupling a HgCdTe photodetector array to a silicon readout circuit by interposing a sapphire buffer layer therebetween and to further provide a method of fabricating a sapphire buffer layer suitable for indirectly coupling a HgCdTe photodetector array to a silicon readout integrated circuit.

SUMMARY OF THE INVENTION

The foregoing problems are overcome and the objects of the invention are met by, in accordance with the apparatus and method of the invention, a Group II–VI photodetector array which is coupled to a silicon readout circuit by means of a thermal/mechanical buffer which is interposed between the array and the readout circuit. The buffer is comprised of a body of material which has a characteristic coefficient of thermal expansion which is more similar to that of the Group II–VI material than the coefficient of thermal expansion of silicon. One presently preferred material for the buffer is $Al_2O_3$. The buffer has a plurality of conductive vias formed therethrough, each of the conductive vias being "bumped" with indium at opposite ends. The buffer accommodates the differing coefficients of thermal expansion of HgCdTe and silicon, thereby relieving thermally generated stresses with a consequent improvement in the reliability of the resulting hybrid structure.

In accordance with one aspect of the invention there is disclosed a buffer structure interposed between a surface of a photodetector array comprised of HgCdTe and a surface of a readout integrated circuit comprised of silicon. The structure has a coefficient of thermal expansion selected for accommodating the coefficient of thermal expansion of the HgCdTe photodetector array to the coefficient of thermal expansion of the silicon readout integrated circuit in order to minimize mechanical stress within the photodetector array resulting from unequal expansion or contraction of the HgCdTe and silicon during a change in ambient temperature.

In accordance with a preferred embodiment of the invention there is disclosed a buffer structure for being interposed between at least one photodetecting array device and at least one photodetector readout device. The buffer structure includes a substantially planar body having first and second major surfaces comprised of single crystal $Al_2O_3$, the body having a thickness which is substantially less than a length or a width of the body. The buffer structure also includes a plurality of electrical conductors disposed completely through the body between the first and the second major surfaces and a plurality of indium bumps individual ones of which are conductively coupled to an end of one of the electrical conductors.

In accordance with one method of the invention there is disclosed a method of fabricating a buffer structure for coupling a photodetecting array to a silicon readout chip, the photodetecting array being comprised of Group II–VI material. The method includes the steps of providing a substantially coplanar body member comprised of material having a coefficient of thermal expansion which is similar to that of the Group II–VI material; forming a plurality of open channels through the body member between first and second opposed major surfaces thereof; filling each of the channels with an electrically conductive material to form a plurality of electrically conductive vias through the body member; and forming, on ends of each of the conductive vias, an electrically conductive contact suitable for making an electrical connection to a conductive pad.

In accordance with another method of the invention there is disclosed a method of hybridizing a photodetecting array comprised of Group II–VI material to a silicon readout chip. This method includes the steps of providing a readout chip comprised of silicon, the readout chip having a first plurality of conductive pads disposed on a surface thereof, each of the first plurality of pads being coupled to a readout chip unit cell and providing a photodetecting array comprised of Group II–VI material, the array having a second plurality of conductive pads disposed on a surface thereof, each of the second plurality of pads being coupled to an array unit cell. This method further includes a step of interposing a buffer structure between the surface of the readout chip and the surface of the photodetecting array, the buffer structure comprising a coplanar body member having a plurality of conductive vias formed therethrough and a plurality of electrical contact members formed on opposing ends of the vias, each of the vias being in registration with one of the first plurality of pads and one of the second plurality of pads for conductively coupling the pads together through the electrical contact members.

BRIEF DESCRIPTION OF THE DRAWINGS

The foregoing aspects of the invention will be made more apparent in the ensuing Detailed Description of a Preferred Embodiment read in conjunction with the accompanying Drawing wherein.

DETAILED DESCRIPTION OF A PREFERRED EMBODIMENT

Figure 1:
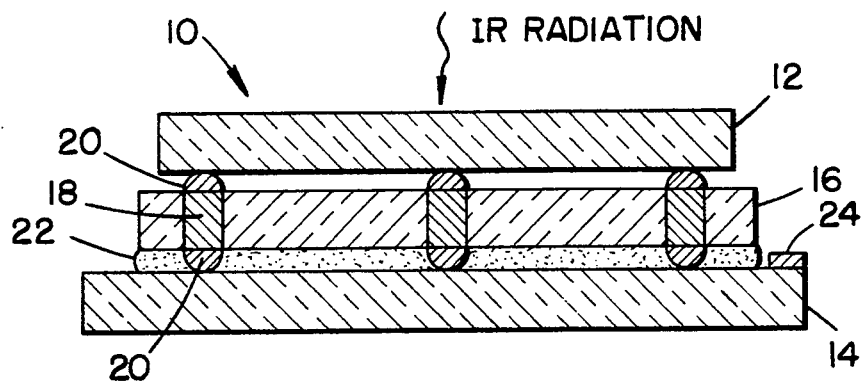
FIG. 1 is a cross-sectional view, not to scale, of a HgCdTe/Si hybrid circuit 10 having a buffer layer 16 of sapphire interposed between a photodetector array 12 and a readout circuit 14.

Referring now to FIG. 1 there is shown a hybrid circuit 10 having an embodiment of the invention. Hybrid circuit 10 comprises a photodetector array 12 which is preferably comprised of a Group II–VI material, such as HgCdTe. In some embodiments of the invention the array 12 may also comprise CdTe and/or other Group II–VI alloys. IR radiation incident upon a surface of the array is absorbed therein and converted into electrical charge carriers. The array 12 typically comprises a two dimensional array of either photoconductive elements or photovoltaic elements. Typically, a relatively large area array will comprise many thousands of such elements. In order to extract the electrical signals generated by the array due to the absorption of incident radiation a readout chip or circuit 14 having a plurality of individual unit cell readout circuits integrated thereon is provided. The readout circuit 14 may comprise a plurality of transimpedance amplifiers coupled to multiplexing circuits whereby individual signals generated by individual ones of the radiation detecting elements are read out to a suitable signal processing means. In some conventional hybrid circuits the array 12 is coupled directly to the silicon readout circuit 14 by means of a plurality of "bumps" which are typically comprised of indium. Due to the aforementioned problems related to stresses generated by the mismatch of the thermal expansion coefficients of HgCdTe and silicon such directly coupled hybrid circuits have been found to have a reliability less than a desired reliability when repetitively thermally cycled between ambient temperature and the significantly lower operating temperature of the array.

To overcome this reliability problem hybrid circuit 10, in accordance with the invention, comprises a buffer structure 16 which is comprised of a material which accommodates the difference in thermal expansion coefficients of the HgCdTe and silicon. In a preferred embodiment of the invention buffer structure 16 is comprised of a coplanar body of sapphire ($Al_2O_3$). It should be realized however that the invention may also be practiced with a body comprised of some other suitable material which is intrinsically or is processed to be an electrical insulator and also which has a mechanical strength sufficient to resist excessive deformation. Of course, the selected material should also have a coefficient of thermal expansion which is more similar to that of the Group II–VI material of the array 12 than that of silicon. It should also be pointed out that the selected material preferably should also be an efficient thermal conductor. $Al_2O_3$ has excellent thermal conductivity properties.

Buffer structure 16 has a plurality of electrical conductors, or vias 18 formed therethrough, individual ones of the vias 18 being in registration with unit cells of the array 12 and the readout circuit 14. Each of the vias 18 is further provided with electrically conductive indium bumps 20 at opposing ends thereof.

After fabrication of the buffer structure 16, which will be described in detail below, the buffer structure 16 is interposed between the array 12 and the readout circuit 14. Conventional cold weld indium bump technology may then be employed to couple the bumps 20 of the structure 16 to corresponding interconnection pads (not shown in FIG. 1) provided on the array 12 and the readout circuit 14. Preferably, the buffer structure 16 is further coupled to the readout circuit 14 by a layer of epoxy 22 which is wicked in between the buffer structure 16 and the readout circuit 14.

In some embodiments of the invention it may be desirable to design the readout circuit 14 such that bonding pads 24, which form the input and output connections to the hybrid circuit 10, are situated such that they extend out on the edge of the silicon chip 14, beyond the overlying edge of the sapphire buffer 16. This provides for a plurality of readout circuits 14 to be closely butted together and interconnected through the bonding pads 24, thereby significantly improving the packing density for multiple array focal plane applications.

Figure 2A:
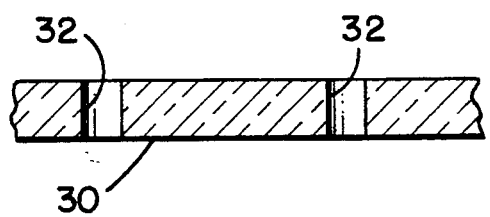
FIGS. 2a–2d show various steps of a method of fabricating the buffer layer and of coupling the buffer layer to the silicon readout device.

Referring now to FIGS. 2a–2d there are illustrated various steps of a method of fabricating the buffer 16 and of coupling the fabricated buffer 16 to the silicon readout circuit 14. In FIG. 2a there is shown a portion of a coplanar crystalline $Al_2O_3$ structure 30 having a plurality of open channels or holes 32 made therethrough. The structure 30 may have a surface area that is substantially equal to that of the photodetecting array. For example, the structure 30 may be approximately 0.25 inches square. The thickness of the structure 30 may be approximately 0.01 inch. The exact thickness is variable, it being realized that the thicker that the structure 30 is made the more of a beneficial result will occur. Each of the holes 32 is formed through the structure 30 by microdrilling, preferably by means of a laser drill. Each of the holes 32 is drilled such that the holes will be in registration with conductive pads which are coupled to the unit cells of the photodetector array and to the silicon readout circuit. The diameter of each of the holes may be approximately one mil, although for some applications this diameter may range from 0.5 to 1.5 mils. The actual diameter for a given application is typically a function of the area occupied by the unit cells of the photodetecting array and the individual readout circuits.

Figure 2B:
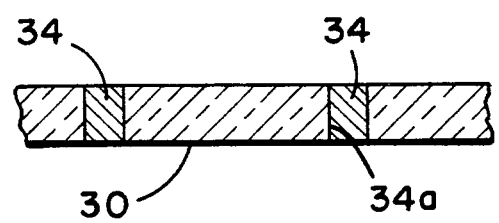

Referring to FIG. 2b the holes 32 are coated with an electrically conductive material 34a, such as gold, copper, indium or aluminum, by means of, for example, a vapor deposition process. After the holes are coated with the electrically conductive material 34a the coated holes are electroplated to fill the remaining volume with conductive material 34, thereby forming a continuous, electrically conductive via between the two major surfaces of the structure 30. Alternatively, the holes may be filled by depositing conductive material immediately adjacent to the openings and thereafter heating the material to its melting point. The molten material thereafter flows into and through the channels by capillary action.

After forming the vias both sides of the sapphire structure 30 are preferably lapped to remove any surface irregularities created during the via forming process. This lapping process also restores the planarity of the sapphire surfaces.

Thereafter, both sides of the sapphire structure 30 are patterned with a, for example, Ti/Au/Ni alloy to provide barrier pads positioned at each of the via sites as well as to provide alignment targets for use during the subsequent hybridization process. This step of providing the barrier pads may be accomplished by conventional thin film deposition and photolithographic patterning techniques.

Figure 2C:
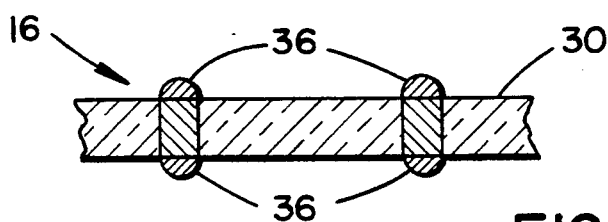

In FIG. 2c it can be seen that the barrier pads and the underlying ends of the vias exposed on both sides of the structure 30 thereafter have indium bumps 36 selectively deposited thereon such as by a conventional lift-off process.

Figure 2D:
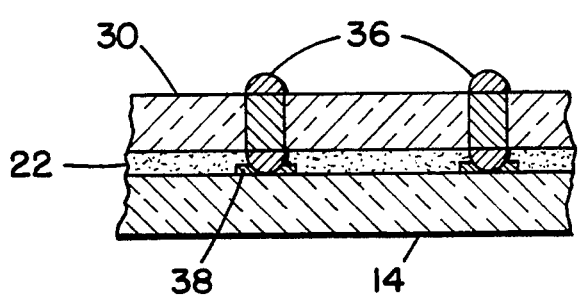

Referring to FIG. 2d it can be seen that after the buffer structure 30 has been bumped it is physically and electrically coupled on one surface to pads 38 on the silicon readout circuit 14. This coupling process may be accomplished by conventional indium bump cold weld techniques. Thereafter, a layer of epoxy 22 is wicked in to insure the mechanical stability of the silicon/sapphire structure. Finally, the HgCdTe photodetector array is hybridized to the opposite surface of the sapphire structure 30 also by conventional indium bump cold weld techniques, as seen in FIG. 1. Preferably, epoxy is not wicked in between the array 12 and the buffer 16 so that the thermal expansion characteristics of the HgCdTe array 12 and the buffer 16 are not interfered with.

A greater appreciation of the beneficial effects of the buffer layer of the invention can be gained by a comparison of the expansivities set forth in the following table. As is known, the expansivity of a material is the integral of the thermal expansion coefficient, given by the equation $$\text{EXPANSIVITY} = \int_{300}^{77} \alpha (T) dT \quad (1)$$

where $\alpha$ is the coefficient of thermal expansion and wherein the integral is taken over a range of temperatures. In this example the integral is taken over the range of 77K to 300K.

Si $0.24 \times 10^{-3}$
$Al_2O_3$ $0.62 \times 10^{-3}$
HgCdTe $0.93 \times 10^{-3}$ As can be seen, the difference between Si and HgCdTe is significantly greater than the difference between $Al_2O_3$ and HgCdTe. Inasmuch as HgCdTe is relatively brittle as compared to crystalline Si, mechanical stresses which are generated within directly hybridized HgCdTe/Si can be sufficient to physically deform and even crack a HgCdTe array. This problem is enhanced as the linear dimensions of the array are made larger. Also, the stresses placed on the intervening indium bumps can be sufficient to cause mechanical failure of the bump, resulting in an open electrical circuit.

$Al_2O_3$ however has a coefficient of thermal expansion which is substantially closer to HgCdTe than Si. Furthermore, $Al_2O_3$ is more structurally robust than relatively brittle HgCdTe and also has the properties of being an excellent electrical insulator and also having an excellent thermal conductivity. Thus, the interposed buffer structure absorbs and mediates the stresses between the Si and HgCdTe, resulting in a significant improvement in reliability for hybrids which are repetitively cycled between ambient temperature and the typically much lower operating temperature of the array. The electrical insulation properties further permit the conductive vias to be formed through the buffer while maintaining a high degree of electrical isolation between adjacent vias.

Figure 3:
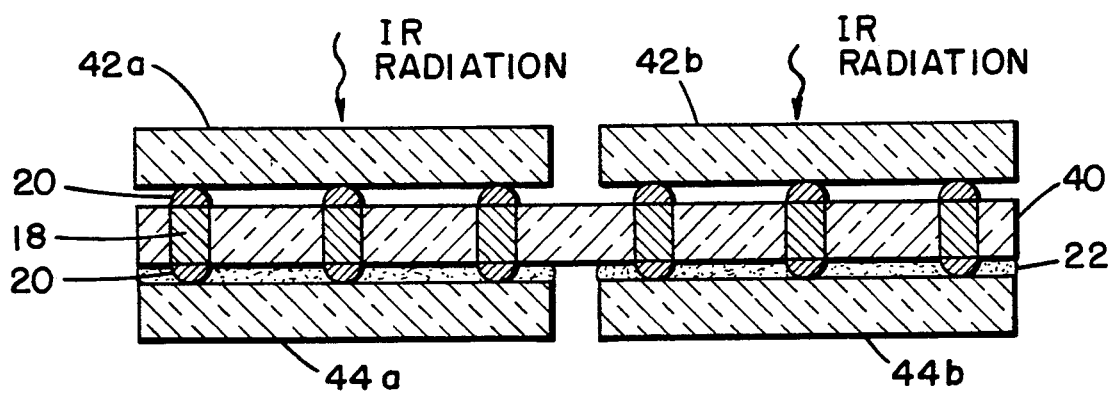
FIG. 3 is a cross-sectional view, not to scale, showing another embodiment of the invention wherein a plurality of HgCdTe arrays 42 are provided with a common buffer layer 40 for coupling each of the arrays to a corresponding readout circuit 44.

Referring now to FIG. 3 there is shown another aspect of the invention wherein it can be seen that a single $Al_2O_3$ buffer layer 40 is employed with a plurality of photodetecting arrays 42a and 42b and a corresponding plurality of readout circuits 44a and 44b. The fabrication of the buffer layer 40 is substantially identical to that as described above. One advantage of the embodiment of FIG. 3 is that a substantial increase in packing density can be achieved in a multi-detector HgCdTe/Si hybrid. This aspect of the invention is of course not limited to only two photodetecting arrays and readout chips and will readily accommodate a significant number of each type of device.

It can be appreciated that a preferred embodiment of the invention has been provided above and that modifications to this preferred embodiment may occur to those having skill in the art. Therefore, the present invention is not to be considered to be limited to only this preferred embodiment but is instead intended to be limited only as defined by the appended claims.

What is claimed is:

1. A buffer structure interposed between a surface of a photodetector array comprised of Group II–VI material and a surface of a readout integrated circuit comprised of silicon, the structure having a coefficient of thermal expansion selected for accommodating the coefficient of thermal expansion of the photodetector array to the coefficient of thermal expansion of the silicon readout integrated circuit to minimize mechanical stress within the photodetector array resulting from unequal expansion or contraction of the Group II–VI material and silicon during a change in ambient temperature.

2. A buffer structure as claimed in claim 1 wherein the structure includes a substantially planar body comprised of sapphire.

3. A buffer structure as claimed in claim 2 wherein the structure further comprises a plurality of electrical conductors disposed through the body between first and second opposing major surfaces thereof, each of the electrical conductors being in registration with a unit cell of the array for electrically coupling the unit cell to a unit cell readout circuit on the readout integrated circuit.

4. A buffer structure as claimed in claim 3 wherein opposing ends of each of said electrical conductors are substantially coplanar with the first and the second major surfaces of the body, each of the ends having a conductive coupler means formed thereon for electrically coupling one of the array unit cells to a corresponding readout circuit unit cell.

5. A buffer structure as claimed in claim 4 wherein each of the electrical conductors is comprised of gold, copper, aluminum, indium or combinations thereof.

6. A buffer structure as claimed in claim 4 wherein each of the conductive coupler means comprises an indium bump.

7. A buffer structure for being interposed between at least one photodetecting array device and at least one photodetector readout device comprising:
a substantially planar body comprised of $Al_2O_3$, said body having oppositely opposed first and second major surfaces, said body having a thickness which is substantially less than a length or a width of said body;
a plurality of electrical conductors disposed completely through said body in a substantially perpendicular manner between said first and said second major surfaces; and
a plurality of indium bumps individual ones of which are conductively coupled to an end of one of said electrical conductors.

8. A buffer structure as claimed in claim 7 wherein the thickness of said body is approximately one ten thousandths of an inch.

9. A buffer structure as claimed in claim 7 wherein said electrical conductors have a length substantially equal to the thickness of said body and a width within a range of approximately 0.5 mils to approximately 1.5 mils.

10. A method of fabricating a buffer structure for coupling a photodetecting array to a silicon readout chip, the photodetecting array being comprised of Group II–VI material, comprising the steps of:
providing a substantially coplanar body member comprised of an electrically insulating material;
forming a plurality of open channels through the body member between first and second opposed major surfaces thereof;
filling each of the channels with an electrically conductive material to form a plurality of electrically conductive vias through the body member; and
forming, on opposing ends of each of the conductive vias, an electrically conductive contact suitable for making an electrical connection to an electrically conductive pad.

11. A method as defined in claim 10 wherein the step of forming is accomplished by laser drilling a plurality of holes through the body member.

12. A method as defined in claim 11 wherein the holes are laser drilled to have a diameter within a range of approximately 0.5 mil to 1.5 mil.

13. A method as defined in claim 10 wherein the step of filling includes a step of vapor depositing metal into the channels.

14. A method as defined in claim 10 wherein the step of forming an electrically conductive contact is accomplished by forming an indium bump upon an end of each of the vias.

15. A method as defined in claim 10 wherein the step of forming an electrically conductive contact is accomplished by the steps of:
lapping the first and the second major surfaces;
patterning both the first and the second major surfaces with a Ti/Au/Ni alloy over the ends of the vias; and
depositing an indium bump on each of the patterned ends of the vias.

16. A method as defined in claim 15 wherein the step of depositing is accomplished by a liftoff process.

17. A method as defined in claim 10 wherein the Group II–VI material is comprised of HgCdTe.

18. A method as defined in claim 10 wherein the body member is comprised of $Al_2O_3$.

19. A method of hybridizing a photodetecting array comprised of Group II–VI material to a silicon readout chip, comprising the steps of:
providing a readout chip comprised of silicon, the readout chip having a first plurality of conductive pads disposed on a surface thereof, each of the first plurality of pads being coupled to a readout chip unit cell;
providing a photodetecting array comprised of Group II–VI material, the array having a second plurality of conductive pads disposed on a surface thereof, each of the second plurality of pads being coupled to an array unit cell; and
interposing a buffer structure between the surface of the readout chip and the surface of the photodetecting array, the buffer structure comprising a coplanar body member having a plurality of conductive vias formed therethrough and a plurality of electrical contact members formed on opposing ends of the vias, each of the vias being in registration with one of the first plurality of pads and one of the second plurality of pads for conductively coupling the pads together through the electrical contact members.

20. A method as claimed in claim 19 wherein the step of interposing is accomplished by the steps of:
- positioning the buffer structure upon the surface of the readout chip such that each of the first plurality of pads are in contact with one of the contact members;
- cold welding the first plurality of pads to the contact members;
- positioning the photodetecting array upon the buffer structure such that each of the second plurality of pads are in contact with one of the contact members; and
- cold welding the second plurality of pads to the contact members.

21. A method as claimed in claim 20 wherein the step of cold welding the first plurality of pads includes an additional step of wicking in a layer of epoxy between the readout chip and the buffer structure.

\* \* \* \* \*